United States Patent
Hamamoto

(10) Patent No.: US 6,218,277 B1
(45) Date of Patent: Apr. 17, 2001

(54) METHOD FOR FILLING A VIA OPENING OR CONTACT OPENING IN AN INTEGRATED CIRCUIT

(75) Inventor: Kazuhiro Hamamoto, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/236,799

(22) Filed: Jan. 25, 1999

Related U.S. Application Data

(60) Provisional application No. 60/072,568, filed on Jan. 26, 1998.

(51) Int. Cl.[7] .................. H01L 21/44; H01L 21/4763
(52) U.S. Cl. ................. 438/597; 438/672; 438/687; 438/688; 438/640; 438/618
(58) Field of Search ................... 438/643, 642, 438/618, 627, 653, 669, 672, 632, 640, 673, 597, 687, 688

(56) References Cited

U.S. PATENT DOCUMENTS

| | | | |
|---|---|---|---|
| 5,011,793 | 4/1991 | Obinata . | |
| 5,308,792 | 5/1994 | Okabayashi et al. | 437/180 |
| 5,308,793 | * 5/1994 | Taguchi et al. . | |
| 5,364,817 | * 11/1994 | Lur et al. . | |
| 5,527,561 | * 6/1996 | Dobson . | |
| 5,593,919 | * 1/1997 | Lee et al. . | |
| 5,926,736 | * 7/1999 | deSilva . | |
| 5,998,296 | * 12/1999 | Saran et al. . | |

FOREIGN PATENT DOCUMENTS 0516344A    12/1992    (EP) .
3-225829    10/1991    (JP) .

OTHER PUBLICATIONS

Holverson, et al. A Multilevel Al–Plug Technology for Sub–Half Micron Metallization, presented 1995 VMIC Conference Jun. 27–29, 1995 pp. 537–543.

Dixit, et al., Application of High Pressure Extruded Aluminum to ULSI Metallization, Semiconductor International, Aug. 1995, pp. 79–80, 82 and 84–85.

U.S. Pat. application Ser. No. 09/236,716, filed on Jan. 25, 1999, and entitled "Method for Filling a via Opening or Contact Opening in an Integrated Circuit", (Atty. Ref. TI–20883).

* cited by examiner

Primary Examiner—Tuan H. Nguyen
Assistant Examiner—Stephen W. Smoot
(74) Attorney, Agent, or Firm—Dwight N. Holmbo; Wade James Brady III; Frederick J. Telecky Jr.

(57) ABSTRACT

An integrated circuit includes a substrate (12) having a conductive region (18), and includes a dielectric layer (19) disposed over the substrate. An upwardly tapering frusto-conical opening (22) is created through the dielectric layer to the conductive region. A barrier layer (31) is then applied, after which a thin metal layer (32) is applied, the upper end of the opening being pinched off or closed by the metal layer. Heat and pressure are then simultaneously applied, so that the metal layer flows to completely fill the available space within the opening. Selected portions of the metal layer external to the opening are then etched away. A further dielectric layer (41) is applied over the barrier layer and metal layer, and then planarization is carried out on the further dielectric layer.

19 Claims, 2 Drawing Sheets

METHOD FOR FILLING A VIA OPENING OR CONTACT OPENING IN AN INTEGRATED CIRCUIT

This application claims priority under 35 USC §119 (e) (1) of provisional application Ser. No. 60/072,568, filed Jan. 26, 1998.

TECHNICAL FIELD OF THE INVENTION

This invention relates in general to a method of making an integrated circuit and, more particularly, to such a method which reliably and completely fills a via opening or contact opening.

BACKGROUND OF THE INVENTION

When fabricating an integrated circuit, it is known to apply a dielectric layer over a conductive region, and to create a via opening or contact opening through the dielectric layer to the conductive region. The opening may be cylindrical with a vertical wall surface, or may have an upwardly diverging frustoconical shape, which is sometimes referred to as a positive taper. Then, a barrier layer is applied over the dielectric layer, and also covers the exposed surface within the opening.

A metal layer is then deposited over the barrier layer. As the metal layer is deposited, it should be thick enough to pinch off or close the upper end of the opening through the dielectric layer. This usually leaves a cavity in the portion of the metal layer which is disposed within the opening through the dielectric layer. After the metal layer has been deposited, heat and pressure are simultaneously applied, in order to cause the metal to flow so as to eliminate the cavity and completely fill the available space within the opening through the dielectric layer. This is sometimes referred to as reflow of the metal layer. Thereafter, the portion of the metal layer on top of the dielectric layer is typically etched, in order to leave an arrangement of interconnects on top of the dielectric layer. Much of the metal in the metal layer is removed during the etching process.

While this known technique has been generally adequate for its intended purposes, it has not been satisfactory in all respects. For example, in order to ensure that the metal layer will flow so as to eliminate the cavity and fill the available space within the opening, the metal layer must be sufficiently thick when applied to completely pinch off or close the upper end of the opening through the dielectric layer. Since the opening through the dielectric layer has a positive taper or is cylindrical, the applied metal layer must be relatively thick in order to pinch off or close the upper end of the opening. This requires the use of a substantial amount of raw metal, which increases the overall cost of the integrated circuit. Further, to the extent that the portion of the metal layer on top of the dielectric layer is subsequently etched, the thickness of the metal layer means that a significant amount of metal is etched away and discarded during the etching process, and that the production time required for the etching procedure is longer than desirable.

After etching, a dielectric layer is typically applied over the remaining portions of the metal layer. Since the original metal layer was relatively thick, the remaining portions of it will be relatively thick, which in turn means that the dielectric layer will have to be relatively thick, all of which leads to an increased overall thickness for the integrated circuit.

A further consideration relates to the fact that the smallest cross-sectional size or area of the opening determines the resistance to current flow through the metal disposed in the opening. In theory, it is possible to increase the size of the opening, in order to increase the smallest cross-sectional size and thereby reduce the resistance to current flow. However, since the opening is cylindrical or positively tapered, increasing the size inherently increases the size of the opening at its upper end, which in turn increases the thickness which the metal layer must have in order to pinch off or close the upper end of the opening.

SUMMARY OF THE INVENTION

From the foregoing, it may be appreciated that a need has arisen for a method of fabricating an integrated circuit so as to reliably and completely fill a via opening or contact opening, so as to minimize the amount of metal and other materials used, so as to minimize production time, so as to provide a thin and inexpensive integrated circuit, and so as to minimize resistance to current flow through the resulting via or contact. According to the present invention, a method is provided to address this need, and involves the steps of: providing a base structure which includes a conductive portion and includes a nonconductive material over the conductive portion, the nonconductive material having a surface on an upper side thereof; creating through the nonconductive material an opening which has a cross-sectional size that tapers upwardly; depositing over the nonconductive material a metal layer which has a portion covering exposed surfaces of the opening; and thereafter applying heat and pressure to cause the metal layer to flow to fill available space within the opening.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
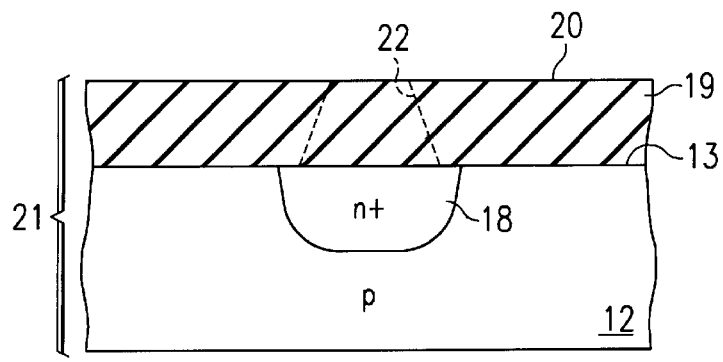
FIGS. 1–8 are diagrammatic sectional side views of a portion of an integrated circuit, and illustrate respective steps in a method for fabricating the integrated circuit according to the present invention.

FIGS. 1–8 are diagrammatical sectional side views of a portion of an integrated circuit, and illustrate respective steps in a method for fabricating the integrated circuit according to the present invention. Referring to FIG. 1, the integrated circuit includes a p-type silicon semiconductor substrate 12 which has a top surface 13. The substrate 12 has therein, adjacent the top surface 13, an n+ region 18. The particular structure of the substrate 12 which is shown in FIG. 1 is purely exemplary, and the invention may be used with a wide variety of other substrate structures.

The integrated circuit further includes a dielectric layer 19, which is made of a nonconductive material such as silicon dioxide, which is provided on the top surface 13 of the substrate 12, and which has a top surface 20 thereon. The substrate 12 and dielectric layer 19 may together be considered to be a base structure 21.

A frustoconical opening 22 is to be created through the dielectric layer 19, or in other words an opening which has a cross-sectional size that tapers upwardly. This opening shape is also called a retrograde opening. The opening may have a transverse dimension or diameter at either the upper or lower end which is about 0.35 μm, although the invention is not limited to an opening of this particular size. One possible technique for creating the opening 22 is described in association with FIGS. 2 and 3, where respective portions of the dielectric layer 19 of FIG. 1 are designated with respective reference numerals 19A and 19B. More specifically, the layer 19A of the dielectric material is deposited on the surface 13 of the substrate 12, and then a cylindrical opening 26 with a substantially vertical wall is etched completely through the layer 19A so as to expose a portion of the top surface of the conductive n+ region 18. Then, the further layer 19B of the dielectric material is deposited on the layer 19A, in a manner so that the portion of layer 19B within the opening 26 defines a frustoconical surface 27. The entire layer 19B is then etched until the portion thereof on the surface of the conductive n+ region 18 has been removed to expose the surface of region 18. The result is the structure shown in FIG. 3, which has the frustoconical opening 22. Since layers 19A and 19B are made of the same material, they may be treated as a single integral layer of that material once they have been formed, which is the layer 19 of FIG. 1.

Figure 4:
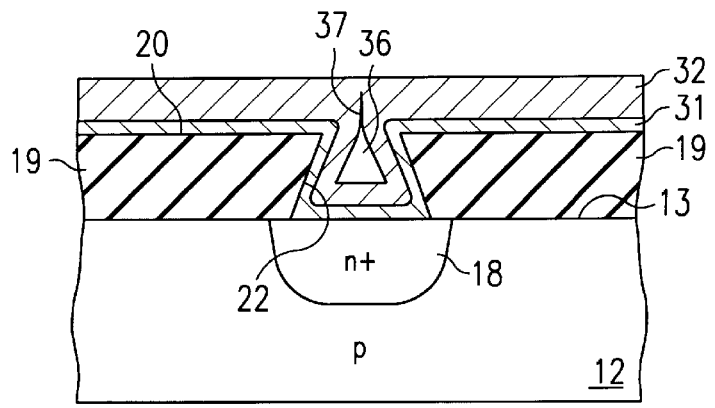

Referring to FIG. 4, a barrier layer 31 is thereafter deposited on the dielectric layer 19 so as to cover the top surface 20, the frustoconical side surface of the opening 22, and the exposed portion of the top surface of the conductive n+ region 18. A suitable material for the barrier layer 31 is titanium nitride, which may be applied using a technique such as collimated deposition, long throw deposition, or ionized sputtering. Alternatively, the barrier layer 31 could be made of some other suitable material, such as tungsten nitride or tantalum nitride.

An aluminum layer 32 is then deposited on the barrier layer 31, for example through sputtering at a temperature of about 400° C. As the aluminum layer 31 reaches a certain thickness during its creation, at 37 it will pinch off or close the upper end of an opening or cavity 36 defined by the aluminum layer within the opening 22. This leaves the cavity 36 with a generally conical shape. The sputtering continues after the cavity 36 is pinched off at 37. Because the walls of the opening 22 have a negative or retrograde taper, the pinch off at 37 occurs when the aluminum layer 32 has a smaller thickness than would be needed to obtain pinch off where the opening 22 had a cylindrical shape or an upwardly diverging frusto-conical shape. Consequently, in the method according to the invention, the final aluminum layer 32 has a thickness which is less than would be the case in an integrated circuit fabricated with a known technique. According to the present invention, the portion of the aluminum layer 32 disposed above the barrier layer 31 will have a thickness in the range of approximately 2,000 Å to 12,000 Å, and typically about 6,000 Å. Although the layer 32 is aluminum in the disclosed embodiment, it would alternatively be possible to use a metal other than aluminum, such as copper.

Figure 5:
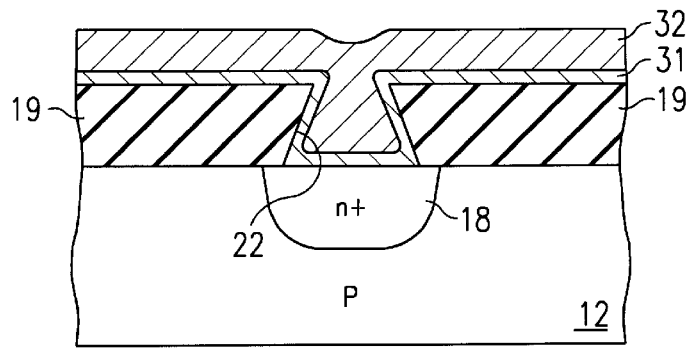

After the aluminum layer 32 has been applied, the structure shown in FIG. 4 is heated to a temperature which may be about 400° C., and is subjected to a pressure of 600 to 700 atmospheres (8,000 to 10,000 psi). If a higher temperature is used, then a lower pressure may be used, whereas if a lower temperature is used, then a higher pressure should be used. However, the temperature will typically be less than the melting temperature of the metal layer 32, which in the case of aluminum is about 660° C. The simultaneous application of heat and pressure causes the material of the aluminum layer 32 to flow into the opening 22 so as to eliminate the cavity 36 and completely fill the available space within opening 22, as shown in FIG. 5. This may be referred to as reflow of the aluminum layer 32. If a metal other than aluminum is used for the metal layer 32, the temperatures and pressures discussed above may be adjusted to values which are appropriate for that other metal.

Figure 6:
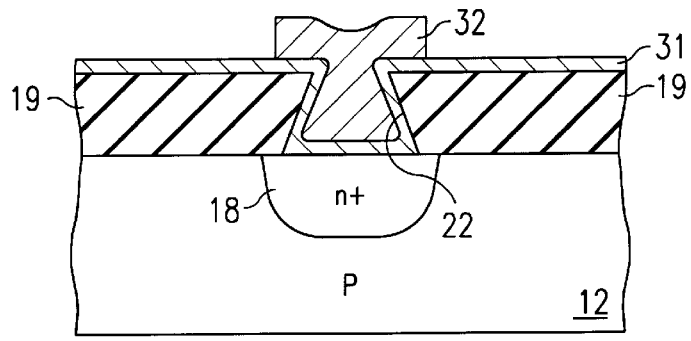

Thereafter, a not-illustrated photoresist is applied to the top of the aluminum layer 32 shown in FIG. 5, and the aluminum layer 32 is then etched so as to leave on the dielectric layer 19 elongate aluminum leads or interconnects which electrically couple the aluminum material in opening 22 with the aluminum material in other similar openings. After the etching step, the photoresist is removed. FIG. 6 shows one possible result of such an etching step, where the portion of aluminum layer 32 which remains above the opening 22 is an elongate lead or interconnect extending perpendicular to the plane of FIG. 6. The conductive n+ region 18 is electrically coupled to the elongate lead or interconnect through the portion of the conductive barrier layer 31 disposed in opening 22 and the frustoconical portion of the aluminum layer 32 disposed in opening 22.

Figure 7:
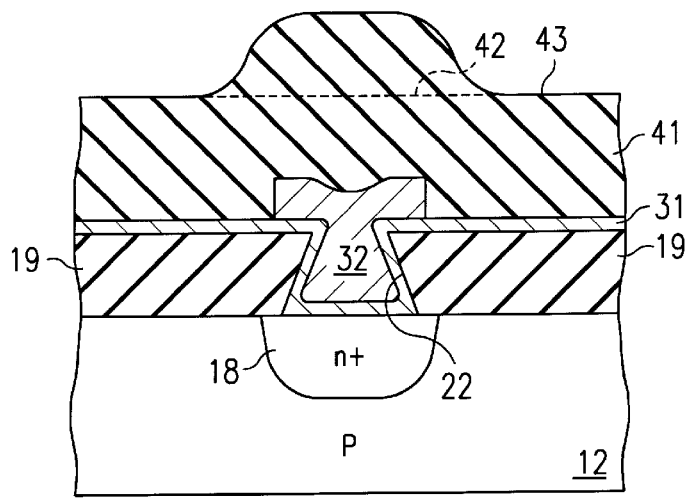

As shown in FIG. 7, a further layer 41 of a dielectric material such as silicon dioxide is then deposited over the barrier layer 31 and the remaining portion of the aluminum layer 32. Since the aluminum layer 32 is thinner than with known techniques, as discussed above, the layer 41 can also be thinner than with known techniques, while still covering the portions of aluminum layer 32 which remain after etching. A planarization is then carried out on the dielectric layer 41 so as to remove at least the material above broken line 42, thereby leaving a relatively planar top surface 43 on the dielectric layer 41. The planarization may be carried out using a known technique such as a chemical mechanical polishing step. The resulting structure is shown in FIG. 8.

Figure 8:
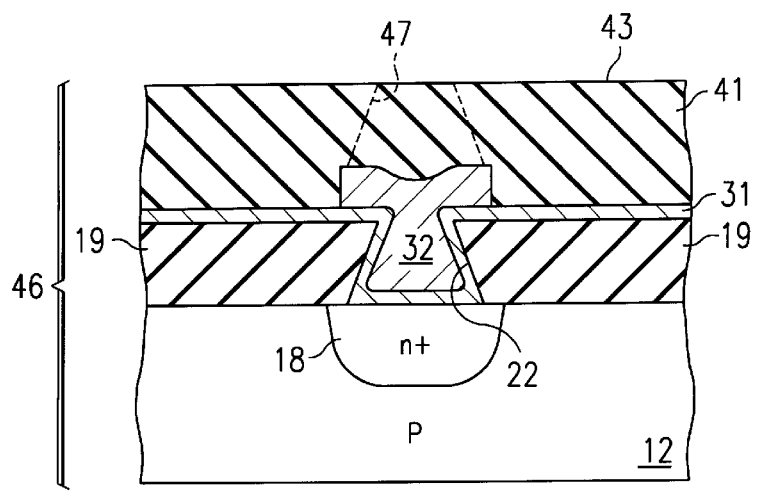

The structure shown in FIG. 8 may be viewed as a base structure 46 on which the above-described process according to the invention can be repeated, in order to fabricate a further leads level. This process would, for example, begin with the creation of an upwardly tapering frustoconical opening 47, which is comparable to the frustoconical opening 22 shown in FIG. 1, and which extends from the top surface 43 to a top surface of the aluminum layer 32. The opening 47 need not be directly over the opening 22.

The present invention provides numerous technical advantages. One such technical advantage results from the use of an upwardly tapering or retrograde opening in conjunction with metal reflow, in that available space within the opening is more completely and reliably filled with aluminum than is the case with known techniques. A further advantage is that the required metal layer is thinner than in the known technique, which means less wasted metal material, and yields a thinner and cheaper integrated circuit. Further, there is less metal material that needs to be subsequently etched away, which in turn means that less time is required for etching. Since the metal layer is thinner, the dielectric layer applied over it after etching can be thinner, which also contributes to a thinner and cheaper integrated circuit. A further advantage is that the upwardly tapering retrograde opening has a wide lower end, which provides a relatively large area through which current can flow between the metal layer and a conductive region, which in turn means reduced resistance to current flow.

Figure 2:
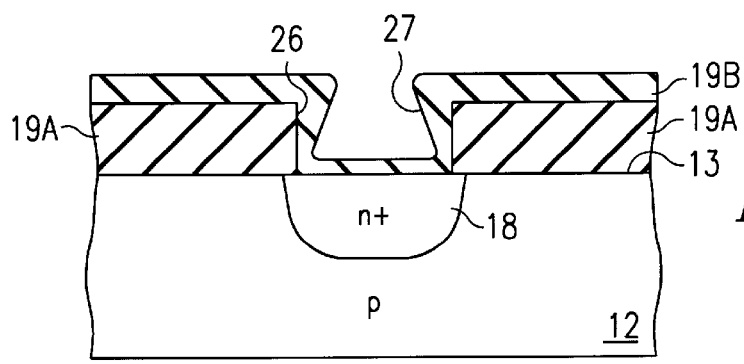
Figure 3:
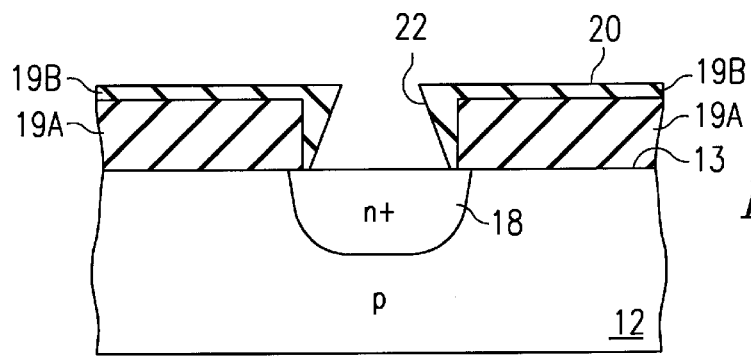

Although one embodiment has been illustrated and described in detail, it should be understood that various changes, substitutions and alterations can be made therein without departing from the scope of the present invention. For example, although an exemplary substrate structure has been illustrated and described, it will be recognized that the present invention is suitable for use with a variety of other substrate structures. As another example, the disclosed embodiment uses silicon dioxide as a dielectric material, titanium nitride as a barrier layer, and aluminum as a metal layer, but it will be recognized that other suitable materials may be substituted for one or more of these materials. In addition, one technique for forming an upwardly tapering or retrograde opening is shown in FIGS. 2 and 3 and is described in detail, but it will be recognized that other techniques may alternatively be used to create an opening with this shape. Other changes, substitutions and alterations are also possible without departing from the spirit and scope of the present invention, as defined by the following claims.

What is claimed is:

1. A method for fabricating an integrated circuit, comprising the steps of:
   providing a base structure which includes a conductive portion;
   depositing a first layer of nonconductive material over the conductive portion, the first layer of nonconductive material having a surface on an upper side thereof;
   creating a cylindrical opening through the first layer of nonconductive material to the conductive portion;
   depositing a second layer of the nonconductive material over the first layer of the nonconductive material and within the cylindrical opening to create an upwardly converging frustoconical surface within the cylindrical opening;
   etching the second layer of nonconductive material until a portion thereof on the surface of the conductive portion has been removed to create an upwardly converging frustoconical opening through the nonconductive material from the conductive portion;
   depositing over the nonconductive material a metal layer which has a portion covering exposed surfaces of the opening; and
   thereafter simultaneously applying heat and pressure to cause the metal layer to flow to fill available space within the opening.

2. A method according to claim 1, wherein an open end of the opening is closed off by the metal layer during said depositing a metal layer step.

3. A method according to claim 1, including after said step of simultaneously applying heat and pressure the additional steps of applying a photoresist to the metal layer, etching the metal layer, removing the photoresist, applying a nonconductive layer, and carrying out a planarizing process on the nonconductive layer.

4. A method according to claim 1, wherein the nonconductive material is silicon dioxide.

5. A method according to claim 1, including between said steps of etching and depositing a metal layer, the step of depositing a barrier layer over the nonconductive material, the metal layer being deposited over the barrier layer.

6. A method according to claim 5, wherein said depositing a metal layer step includes the step of forming the portion of the metal layer on the barrier layer with a thickness which is in the range of 2,000 Å to 12,0000 Å.

7. A method according to claim 5, wherein said depositing a metal layer step is carried out by using one of aluminum and copper as the metal layer, and includes the step of forming the portion of the metal layer on the barrier layer with a thickness which is in the range of 2,000 Å to 12,000 Å.

8. A method according to claim 5, wherein the barrier layer is made from one of titanium nitride, tungsten nitride, and tantalum nitride.

9. A method for fabricating an integrated circuit, comprising the steps of:
   providing a base structure which includes a conductive portion;
   depositing a first layer of nonconductive material over the conductive portion, the first layer of nonconductive material having a surface on an upper side thereof;
   creating a cylindrical opening through the first layer of nonconductive material to the conductive portion;
   depositing a second layer of the nonconductive material over the first layer of the nonconductive material and within the cylindrical opening to create an upwardly converging frustoconical surface within the cylindrical opening;
   etching the second layer of nonconductive material until a portion thereof on the surface of the conductive portion has been removed to create an upwardly converging frustoconical opening through the nonconductive material from the conductive portion;
   depositing over the nonconductive material a barrier layer which covers exposed surfaces in the opening;
   thereafter depositing over the barrier layer a thin layer of aluminum which closes off the opening at an upper end thereof; and
   thereafter simultaneously applying heat and pressure to cause the aluminum layer to flow to fill available space within the opening.

10. A method according to claim 9, including after said step of simultaneously applying heat and pressure the additional steps of applying a photoresist to the aluminum layer, etching the aluminum layer, removing the photoresist, applying a nonconductive layer, and carrying out a planarizing process on the nonconductive layer.

11. A method for fabricating an integrated circuit, comprising the steps of:
    providing a base structure which includes a conductive portion and includes a nonconductive material over the conductive portion, the nonconductive material consisting of silicon dioxide having a surface on an upper side thereof;
    creating an upwardly converging frustoconical opening through the silicon dioxide from the conductive portion;
    depositing over the silicon dioxide a metal layer which has a portion covering exposed surfaces of the opening; and
    thereafter simultaneously applying heat and pressure to cause the metal layer to flow to fill available space within the opening.

12. The method according to claim 11, including between said steps of creating and depositing, the step of depositing a barrier layer over the nonconductive material, the metal layer being deposited over the barrier layer.

13. The method according to claim 12, wherein said depositing step includes the step of forming the portion of the metal layer on the barrier layer with a thickness which is in the range of 2,000 Å to 12,000 Å.

14. The method according to claim 12, wherein said depositing step is carried out by using one of aluminum and copper as the metal layer, and includes the step of forming the portion of the metal layer on the barrier layer with a thickness which is in the range of 2,000 Å to 12,000 Å.

15. The method according to claim 12, wherein the barrier layer is made from one of titanium nitride, tungsten nitride, and tantalum nitride.

16. The method according to claim 11, wherein an open end of the opening is closed off by the metal layer during said depositing step.

17. The method according to claim 11, including after said step of simultaneously applying heat and pressure the additional steps of applying a photoresist to the metal layer, etching the metal layer, removing the photoresist, applying a nonconductive layer, and carrying out a planarizing process on the nonconductive layer.

18. A method for fabricating an integrated circuit, comprising the steps of:

providing a base structure which includes a conductive portion and includes a nonconductive material over the conductive portion, the nonconductive material consisting of silicon dioxide having a surface on an upper side thereof;

creating an upwardly converging frustoconical opening through the silicon dioxide from the conductive portion;

depositing over the silicon dioxide a barrier layer which covers exposed surfaces in the opening;

thereafter depositing over the barrier layer a thin layer of aluminum which closes off the opening at an upper end thereof; and thereafter simultaneously applying heat and pressure to cause the aluminum layer to flow to fill available space within the opening.

19. The method according to claim 18, including after said step of simultaneously applying heat and pressure the additional steps of applying a photoresist to the aluminum layer, etching the aluminum layer, removing the photoresist, applying a nonconductive layer, and carrying out a planarizing process on the nonconductive layer.

\* \* \* \* \*